United States Patent [19]

Morihara et al.

[11] Patent Number: 4,908,695
[45] Date of Patent: Mar. 13, 1990

[54] COOLING APPARATUS AND SEMICONDUCTOR DEVICE EMPLOYING THE SAME

[75] Inventors: Atsushi Morihara, Katsuta; Yoshio Naganuma, Hitachi; Shuntaro Koyama, Katsuta; Kazuji Yamada, Hitachi; Tasao Soga, Hitachi; Hideo Arakawa, Hitachi; Shunsuke Nogita, Hitachi; Yukio Hishinuma, Hitachi, all of Japan

[73] Assignee: Hitachi, Ltd., Tokyo, Japan

[21] Appl. No.: 178,650

[22] Filed: Apr. 7, 1988

[30] Foreign Application Priority Data

Apr. 8, 1987 [JP] Japan ................... 62-84786

[51] Int. Cl.$^4$ .................. H01L 23/34; H01L 23/36; H01L 23/46
[52] U.S. Cl. ......................... 357/81; 357/82; 361/385
[58] Field of Search ............... 357/79, 81, 82; 165/185, 80.4; 361/385, 386, 387

[56] References Cited

U.S. PATENT DOCUMENTS

| | | | |
|---|---|---|---|
| 4,462,462 | 7/1984 | Meagher et al. | 357/81 |
| 4,607,277 | 8/1986 | Hassan et al. | 357/79 |
| 4,765,400 | 8/1988 | Chu et al. | 357/81 |
| 4,770,242 | 9/1988 | Daikoku et al. | 357/81 |
| 4,800,956 | 1/1989 | Hamburgen | 357/81 |

Primary Examiner—Rolf Hille
Assistant Examiner—S. V. Clark
Attorney, Agent, or Firm—Antonelli, Terry & Wands

[57] ABSTRACT

A heat conducting member is placed in the space between a semiconductor chip which generates heat and a heat transfer block which is cooled by a coolant, and the heat conducting member conducts heat from the semiconductor chip to the heat transfer block. The heat conducting member has a slanted surface which is inclined with respect to a surface to be cooled of the corresponding semiconductor chip. Even when the semiconductor chip is displaced or inclined with respect to the heat transfer block, the whole of the cooling surface of the semiconductor chip can be kept in contact with the corresponding heat conducting member.

10 Claims, 7 Drawing Sheets (a)

(b)

(c)

COOLING APPARATUS AND SEMICONDUCTOR DEVICE EMPLOYING THE SAME

BACKGROUND OF THE INVENTION

1. FIELD OF THE INVENTION

The present invention relates to a novel cooling apparatus for efficiently conducting and radiating heat from semiconductor chips or high-density integrated circuits, and to a semiconductor device combined with the cooling apparatus, as well as a mounting structure for mounting such a semiconductor device on a computer.

2. DESCRIPTION OF THE RELATED ART

Modern large-scale computers are required to cope with high speed processings, and the scale of integration of individual integrated circuits has been increasing. As a result, the quantity of heat generated by each integrated circuit has increased substantially. In this situation, great concern has been raised about the excessive rises in the temperature of integrated circuits which have become common and upon which no special emphasis has previously been placed. In particular, the cooling of integrated circuits has become an important problem to be overcome in the current mounting techniques used for mounting integrated circuit chips on large-scale computers. Also, in order to minimize the length of electrical wires for connecting integrated circuit chips, a method of incorporating a multiplicity of integrated circuit chips into a micropackage has been developed.

In the field of large-scale computer systems in particular, a cooling apparatus of the type as shown in FIG. 4 has previously been proposed. The cooling apparatus illustrated in FIG. 4 is based on a gas-filled thermal conduction cooling system of the type disclosed in Japanese Patent Unexamined Publication No. 61-15353. Large scale integrated circuit (hereinafter referred to as "LSI(s)") chips 11 (only one of which is shown) are connected through extremely small solder balls 17 to a multi-layer printed-wiring board (hereinafter referred to as "board") 8 constituted by a multiplicity of electrically conductive layers and electrically insulating layers, and, in turn, are electrically connected to a multiplicity of pins 12 which project from the reverse side of the multi-layer board 8. A housing 15 is mounted on the board 8 to cover the LSI chips 11. A plurality of cylinders 18 are provided within the housing 15, and each of the cylinders 18 includes a piston 13 for conducting heat from a back surface of the corresponding LSI chip 11 and a spring 14 for applying pressure to the piston 13. The space defined between the board 8 and the housing 15 is charged with a helium gas having good heat conductivity.

Heat generated from the LSI chip 11 is conducted to the piston 13 through heat resistance Rc in the LSI chip 11 and heat resistance Rc p at the contact portion between a spherical end of the piston 13 and the back surface of the LSI chip 11. The heat is further conducted to the housing 15 through the heat resistance Rf of the piston 13 itself and the heat resistance $Rp\_h$ of the helium charged in the space between the piston 13 and the cylinder 18. This heat in turn is radiated through the heat resistance Rh of the housing 15 and the heat resistance Rexf between the housing 15 and the cold water which circulates through an upper portion of the housing 15 or a cooler 16 for circulating a coolant in the latter stage of the cooling process.

Japanese Patent Unexamined Publication No. 58-91665 discloses a structure which is constituted by a similar combination of a piston and a cylinder. In this structure, a piston element is pressed radially as well and is brought into contact with the cylinder.

However, the heat conducting device having the prior art structures described above are limited in capacity, and it is difficult to cool chips having a rating of several tens or more of watts per chip.

In general, the heat conductivity of a helium gas is excellent, about ten times that of other gases, but is extremely low as compared with the heat conductivity of such metal members as the piston 13 and the cylinder 18. Accordingly, the heat resistance $Rp\_h$ of the helium gas (layer) exhibits the highest heat resistance. In order to lower the heat resistance $Rp\_h$, it is necessary to reduce the space between the piston 13 and the cylinder 18. For this reason, the piston 13 or the cylinder 18 must be worked with high precision. Low precision working would downgrade the state of movement of the piston 13, and this may lead to fluctuations in the temperatures of the LSI chips 11.

Japanese Patent Unexamined Publication No. 61-15353 discloses an example in which a medium having good conductivity is charged into the spaces between the pistons 13 and the cylinders 18 in place of a helium gas. In this example, a satisfactory effect cannot be achieved without using a medium of this sort having good conductivity. Furthermore, the piston 13 is formed into a conical shape so as to increase the area of its heat conducting surface, and a suitable level of contact pressure is applied to the grease between the piston 13 and the cylinder 18. However, no direct contact can be obtained between the cylinder 18 and the piston 13, and the heat conductivity of typical types of grease is extremely low, about one-tenth of that which subsists in the case of direct contact.

The above-described prior art involves various other problems. None of the pistons is arranged to follow variations in the position of a corresponding semiconductor device. A complicated structure is needed and, if no heat conducting medium is used, it is impossible to lower the heat resistance. Accordingly, none of the aforesaid cooling apparatus are able to satisfy the requirements of current large-scale computer systems.

SUMMARY OF THE INVENTION

It is therefore an object of the present invention to provide a cooling apparatus which is capable of cooling semiconductor chips upon being brought into surface contact therewith while allowing substantially free displacement of the semiconductor chips even if they are displaced vertically or horizontally or are inclined at any angle.

It is another object of the present invention to provide a semiconductor device combined with the cooling apparatus described above.

It is another object of the present invention to provide a mounting structure for mounting the above semiconductor devices on a computer.

To these ends, in accordance with the present invention, there is provided a cooling apparatus for cooling a semiconductor integrated circuit chip having a cooling flat surface, comprising:

a heat transfer block to be cooled by a coolant;

at least one heat conducting member having a contact flat surface corresponding to the cooling flat surface and being kept in contact with the heat transfer block and the semiconductor integrated circuit chip at the same time; and a resilient member for urging the aforesaid at least one heat conducting member with respect to the heat transfer block and the semiconductor integrated circuit chip;

the aforesaid at least one heat conducting member having at least one inclined surface which is inclined with respect to the cooling flat surface of the semiconductor integrated circuit chip, the aforesaid at least one heat conducting member being capable of sliding and/or rotating while being kept in contact with the heat transfer block so that, even if the semiconductor integrated circuit chip is displaced or inclined in an arbitrary direction with respect to the heat transfer block, the whole of the cooling flat surface of the semiconductor integrated circuit chip can be maintained in contact with the contact surface of the heat conducting member.

Typical heat conducting members as known in the art are designed to primarily compensate for variations in the distance between a heat transfer block and semiconductor chips in a package. In contrast, the present invention enables compensation for variations in a relative inclination between the heat transfer block and the semiconductor chips in addition to the above-described compensation. A method for carrying out the present invention is a simple one such that each heat conducting member is slidably and rotatably supported on a flat surface which is inclined with respect to a cooling surface.

The other objects and features will become apparent from the following description of a preferred embodiment of the present invention, taken with reference to the accompanying drawing.

DETAILED DESCRIPTION OF THE PREFERRED EMBODIMENTS

Preferred embodiment of the present invention will be described below with reference to the accompanying drawings.

Figure 1:
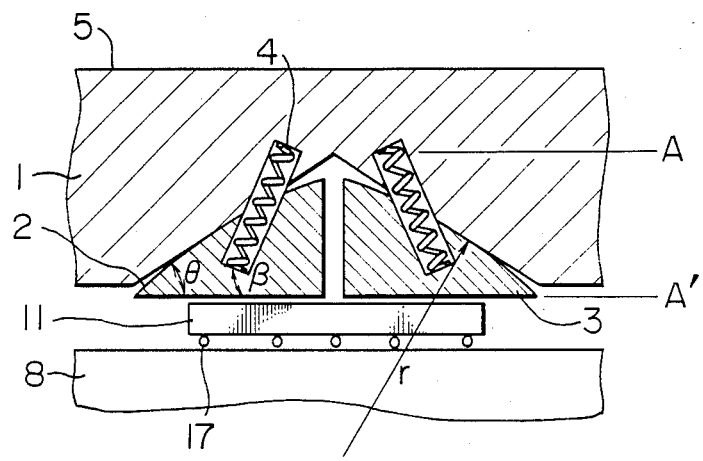
FIG. 1 is a schematic side elevation, partially in section, of the essential portion of a cooling apparatus according to a first preferred embodiment of the present invention.

Referring to FIG. 1 which illustrates a first preferred embodiment, several hundred printed wires (not shown) which are provided on the underside of each of the integrated circuit chips 11 (only one of which is shown) are connected by the spherical solder bumps 17 to the multi-layer board 8 which is formed of a ceramic or the like. A cooling flat surface, that is, the top surface of the integrated circuit chip 11 is in contact with the bottom surfaces of heat conducting members 3. These contact surfaces are subjected to surface treatment in order to improve heat conduction and to minimize frictional forces. In the first embodiment, two heat conducting members 3 are disposed for each of the integrated circuit chips 11, and each of the members 3 is formed into a shape of a trigonal prism having a shape of a right-angled trangle in cross section. As illustrated, the heat conducting members 3 are disposed with a gap therebetween but symmetrically and in side-by-side relationship to form a large combined trigonal prism, thereby providing a large contact flat surface as a whole.

The surface of each of the heat conducting members 3 that is opposite the integrated circuit chip 11 is inclined at an angle of $\theta$ with respect to the corresponding bottom surface. That surface may be a flat surface, but is preferably formed into a curved surface which defines one segment of a cylinder with a radius r. The angle $\theta$ and the radius r are important factors which determine the heat conductong characteristics and motional characteristics of the heat conducting members 3. The larger the angle $\theta$, the larger the area of the heat transfer contact surface between the heat conducting member 3 and a cooling heat transfer block 1. However, any excessive increase in the distance between a cooling surface 5 and the integrated circuit chip 11 is disadvantageous in terms of cooling efficiency. Therefore, the angle $\theta$ is preferably selected to be between 30° and 60° inclusive. If the heat conducting member 3 has a depth H and a width L, the total heat resistance Rt based on the heat resistance of the inclined portion (a portion A-A') is represented by the following equation:

$$Rt = \frac{\tan \theta}{k_b HL} + \frac{\cos \theta}{hHL}$$

where kb is the heat conductivity of the heat transfer block 1 and h is the coefficient of heat transfer at the contact surface between the heat conducting member 3 and the heat transfer block 1. The first term in the right side of the above equation represents the heat resistance of the heat transfer block 1 and the second term in the right side represents the heat resistance at the contact surface. From the above equation, an optimum angle can be calculated as the angle $\theta$ in accordance with such factors as the heat conductivity of the heat transfer block 1 and the heat transfer coefficient at the contact surface.

The radius r is determined by the estimated angle of inclination of the integrated circuit chip 11. In other words, even when the chip 11 is inclined to the maximum allowable extent, it is necessary to keep the curved surface 2 in contact with the inclined surface of the cooling heat transfer block 1. Thus, $$r < \frac{L \tan \theta}{2 \sin \alpha}$$

where α is the maximum angle of inclination of the chip 11. The radius r of the curved surface 2 is determined from the above expression.

The heat conducting member 3 may be allowed to slide freely on the top surface of the corresponding integrated circuit chip 11. Therefore, if springs 4 are inclined as illustrated in FIG. 1, the heat conducting members 3 adjacent to the chip 11 are brought into contact with the corresponding inclined surfaces of the heat transfer block 1 and the top surface of the chip 11 by virtue of a predetermined pressure of each of the springs 4. It is preferable that an angle β between the axis of the spring 4 and the contact surface between the corresponding heat conducting member 3 and the chip 11 is 45° to 70°. Also, it is preferable for two springs 4 to be incorporated at an intermediate position in the depth-wise direction of each pair of heat conducting members 3.

If the chip 11 inclines with respect to the axis of the cylinder the segment of which is defined by each of the curved surfaces 2, each of the heat conducting members 3 is rotated about an axis normal to the contact surface between the heat condcting member 3 and the corresponding inclined surface of the heat transfer block 1 as well as about the axis of the cylinder. Thus, the heat conducting members 3 are each displaced to a suitable position so that a full contact can be maintained between the chip 11 and the heat conducting members 3.

Figure 2:
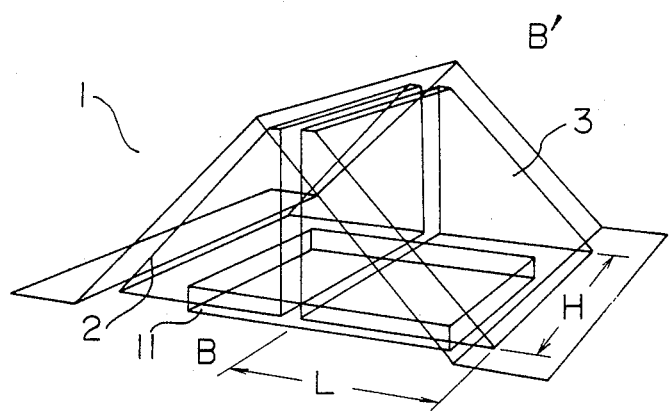
FIG. 2 is a schematic perspective view of the cooling apparatus shown in FIG. 1.

Referring to FIG. 2, if the front of the chip 11 (a side B) inclines downwardly while the opposite side (a side B') inclines upwardly, the heat conducting members 3 are displaced away from each other on the side B but, on the side B', toward each other. The bottom surface of each of the heating conducting members 3 is inclined in accordance with the inclination of the chip 11.

Figure 5:
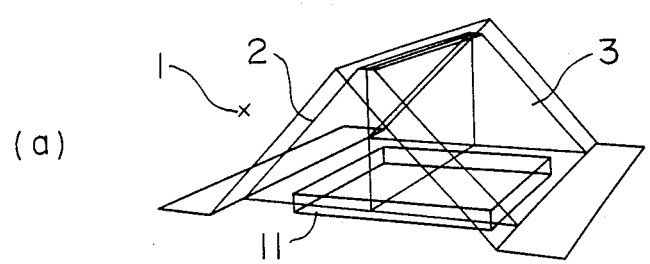
FIG. 5 illustrates the status of each constituent element when a chip is displaced vertically owing to the displacement of an integrated circuit board in the present invention.
Figure 5:
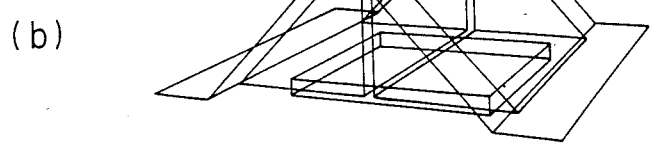
Figure 5:
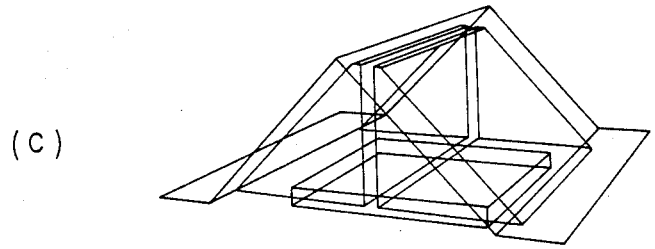

FIG. 5 illustrates the status of each constituent element when the chip 11 is displaced vertically owing to the displacement of the multi-layer ceramic board 8 or the like. If (a) the chip 11 is displaced toward the heat transfer block 1 as compared with a normal state (b), the heat conducting members 3 are displaced toward each other to cancel the displacement. If (c) the chip 11 is displaced away from the heat transfer block 1 as compared with the normal state (b), the heat conducting members 3 are displaced away from each other to cancel the displacement. In either of these cases, the heat conducting members 3 come into contact with the top surface of the chip 11 and corresponding side surfaces of the heat transfer block 1, whereby good heat transfer characteristics can be achieved.

Referring back to FIG. 1, the heat transfer block 1 is housed in the housing 15, and is cooled by a coolant which is in direct contact with the cooling surface 5. A channel through which the coolant is made to flow may be formed through the heat transfer block 1 itself.

A predetermined gap is provided between the two heat conducting members 3 so that they may be displaced with respect to each other in accordance with the inclination of the corresponding chip 11. In addition, it is also preferable that the top end of each of the heat conducting members 3 may be flattened so as to increase the amount of upward displacement thereof with respect to the heat transfer block 1.

Figure 3:
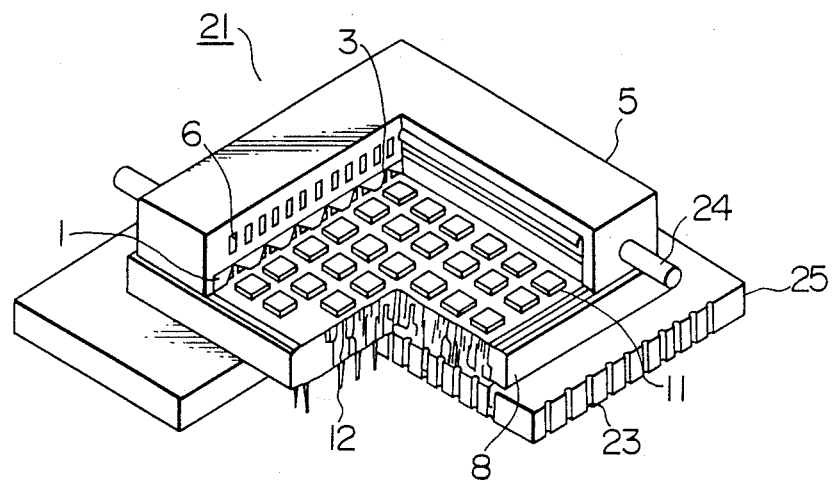
FIG. 3 is a perspective view, with parts broken away and in section, illustrating a semiconductor device to which the cooling apparatus of the present invention is applied.
Figure 4:
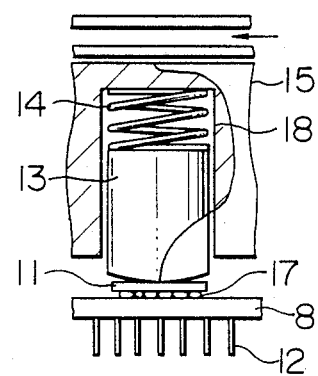
FIG. 4 is a schematic cross sectional view of a cooling apparatus of the prior art.

FIG. 3 is a perspective illustration, with portions partially broken way and in section, of a semiconductor device in which the chip 11 is combined with the cooling apparatus according to the present invention. The cooling according to the present invention is provided in a water-cooled housing 15 made of metal such as Al, Cu, and stainless steel, and a plurality of semiconductor chips 11 are mounted on the ceramic multilayer printed circuit board 8. The housing 15 is bonded to the ceramic multi-layer board 8. The housing 15 is provided with a plurality of holes 6 in which water is introduced as a coolant, and is bonded to the heat transfer block 1. The heat conducting block 1 may of course be formed integrally with the housing 15. The ceramic multi-layer board 8 is formed from a sintered body consisting essentially of alumina, muriates, SiO, AlN, or the $Si_3N_4$ etc., and electrically conductive layers are made of paste of W, Mo or the like. The multi-layer board 8 is provided with the pins 12 which, in turn, are inserted into through-holes 23 formed in a multilayer printed-wiring board 25. Thus, electrical connections are formed between the boards 8 and 25. Cooling water is introduced through a pipe 24 into the water-cooled housing 15. The above-described semiconductor chips 11 are mounted on a ceramic carrier board overlying the ceramic multi-layer printed circuit board 8 and having a thermal expansion coefficient equivalent to that of the ceramic multi-layer board 8. The semiconductor chips 11 and the ceramic carrier board are bonded together by soldering in a flip-flop arrangement, and, preferably, the gap between the semiconductor chips 11 and the ceramic carrier board is charged with rubber granules having a smaller thermal expansion coefficient than the bonding solder and a resin composition containing inorganic powder.

The heat transfer block 1 and the heat conducting members 3 according to the present invention may be made of any one of Cu, Al, SiC, AlN, and Cu-Mo compounds. In particular, the heat transfer block 1 is preferably made of AlN or Cu-Mo compounds, and the heat conducting members 3 are preferably made of Al or Cu. A SiC sintered body preferably is selected from ones which contain 0.1 to 3.5 wt. % of Be and have a thermal expansion coefficient of at least 0.25 cal/cm.sec.° C. and a specific resistance of at least $10^{13} \Omega.cm$.

Figure 6:
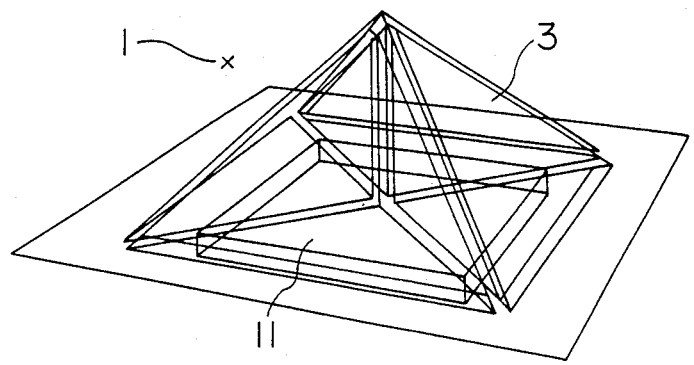
FIG. 6 is a schematic perspective view of a second embodiment of the present invention.

FIG. 6 is a schematic perspective view of a second embodiment of the present invention. The difference between the first and second embodiments consists in the fact that, although the heat conducting members 3 in the first embodiment each have the shape of a trigonal prism, the members in the second embodiment are each formed into the shape of a trigonal pyramid. The basic operation of the second embodiment is the same as that of the first embodiment. The effect characteristic of the second embodiment is that the heat transfer characteristics thereof are not greatly influenced by the inclination of the chip 11.

Figure 7:
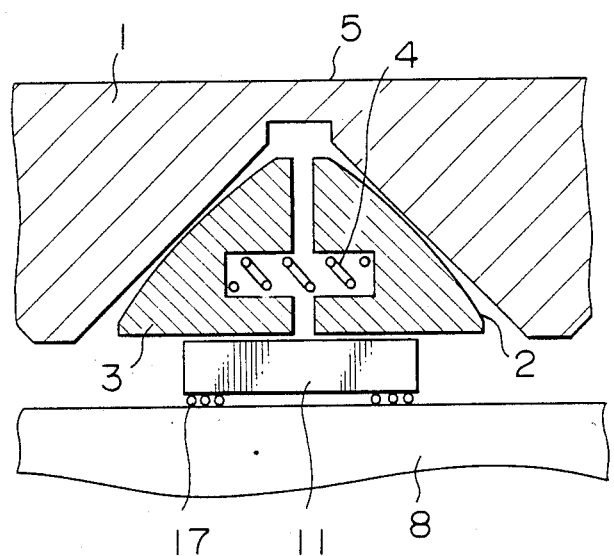
FIG. 7 is a diagrammatical cross sectional view of a third embodiment of the present invention.

FIG. 7 is a cross sectional view of a third embodiment of the present invention. The third embodiment differs from the first embodiment in that the spring 4 is common to the opposing heat conducting member 3, and disposed parallel to the top surface of the corresponding chip 11, in that the heat conducting members 3 are chamfered at their acute edges, and in that the V-shaped recess of the heat transfer block 1 includes additionally a square groove at the deepest corner of the recess. The parallel arrangement of the spring makes simpler the fabrication of the heat conducting members 3 and the heat transfer block 1. The chamfering of the heat conducting member 3 is effective for preventing an intrusion of metal or ceramic dusts, when the conducting member is made of metal, sintered metal, or ceramic materials. The square groove formed at the bottom of the V-shaped recess of the heat transfer block facilitates the cutting work for the V-shaped recess. These advantages of this embodiment assure a cooling apparatus of an increased reliability and a decreased cost. Further, for reducing the heat resistance, a heat conductive medium such as grease may be charged into the gap between the semiconductor chip 11 and the heat conducting member 3 as well as the gap between the heat conducting member 3 and the heat transfer block 1.

Figure 8:
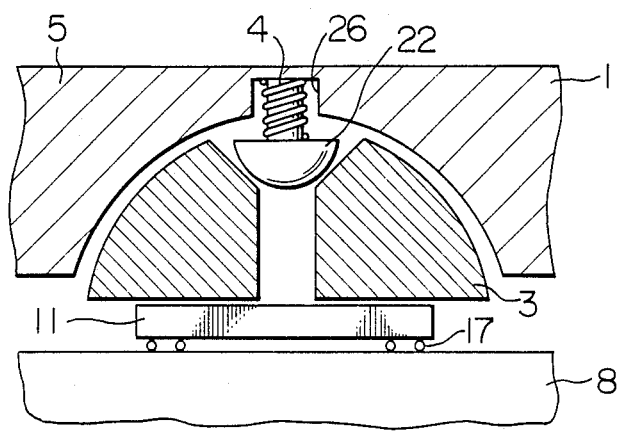
FIG. 8 is a diagrammatic cross sectional view of a fourth embodiment of the present invention.

FIG. 8 is a cross sectional view of a fourth embodiment of the present invention. The fourth embodiment differs from the first embodiment in that, the inner surface of each of the heat transfer blocks 1 that is adjacent to the curved contact surfaces of the heat conducting members 3 is formed into a similar curved shape. The radius of curvature of the outwardly curved surface of each of the heat conducting members 3 is made smaller than the radius of curvature of the inwardly curved surface of the heat transfer block 1. A spherical contact member is provided at one end of each of the springs 4. The effects characteristic of the fourth embodiment are: (1) that, since the spring 4 is vertically disposed, the contact pressure between the heat conducting member 3 and the corresponding chip 11 is increased; and (2) that since the contact surfaces of the heat transfer block 1 are each formed into a curved shape, the contact area between the heat conducting members 3 and the heat transfer block 1 can be widened.

Figure 9:
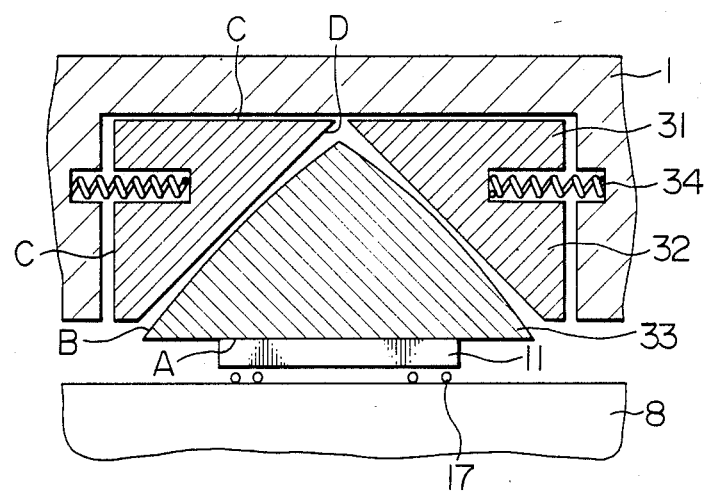
FIG. 9 is a diagrammatic cross sectional view of a fifth embodiment of the present invention.

FIG. 9 is a cross sectional view of a fifth embodiment of the present invention. The fifth embodiment differs from the first embodiment in that three heat conducting members 31, 32 and 33 are employed. More specifically, the heat conducting member 33 is fixed at its cooling surface A to the integrated circuit chip 11 and has inclined surfaces B. The heat conducting members 31 and 32 each have flat surfaces C which come into slidable contact with corresponding surfaces of the heat transfer block 1 and a flat surface D which comes into slidable contact with the flat surface B. Springs 34 are arranged so as to urge the flat surfaces C to come into close contact with the corresponding surfaces of the heat transfer block 1 and to urge the flat surfaces D to come into close contact with the flat surfaces B of the heat conducting member 33. The effect characteristic of the fifth embodiment is that, since each of the chips 11 is fixed to the heat conducting member 33, the temperature distribution in the chip 11 can be readily made uniform.

Figure 10:
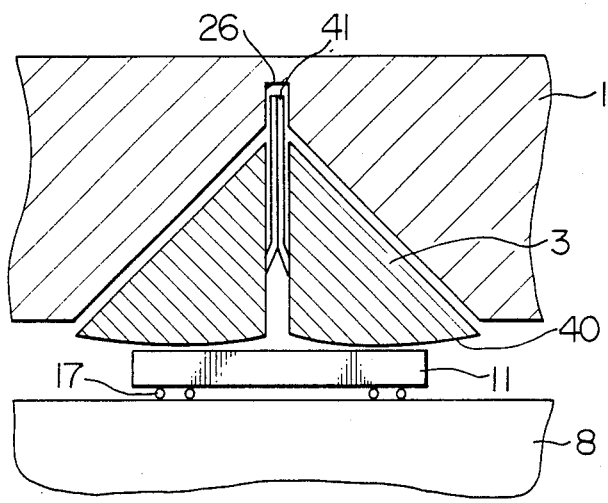
FIG. 10 is a diagrammatic cross sectional view of a sixth embodiment of the present invention.

FIG. 10 is a cross sectional view of a sixth embodiment of the present invention. The sixth embodiment differs from the first embodiment in that the contact surfaces of the heat conducting members 3 facing the integrated circuit chip 11 are each formed into a curved surface 40; and in that leaf springs 41 are used in place of the spring 4. The effect characteristic of the sixth embodiment is that the cost of production can be reduced by the use of the leaf springs 41.

As illustrated, grooves 26 are formed for each receiving one end of the corresponding leaf spring 41. The grooves 26 are effective in preventing upward displacement of the heating conducting members 3 from being restricted, and facilitates cutting of inclined surfaces of the heat transfer block 1. The grooves 26 may be likewise formed in the heat transfer block 1 shown in FIGS. 1 to 3 and FIGS. 5 to 7. It is preferable to form each of the grooves 26 in the heat transfer block 1 over the length thereof.

Figure 11:
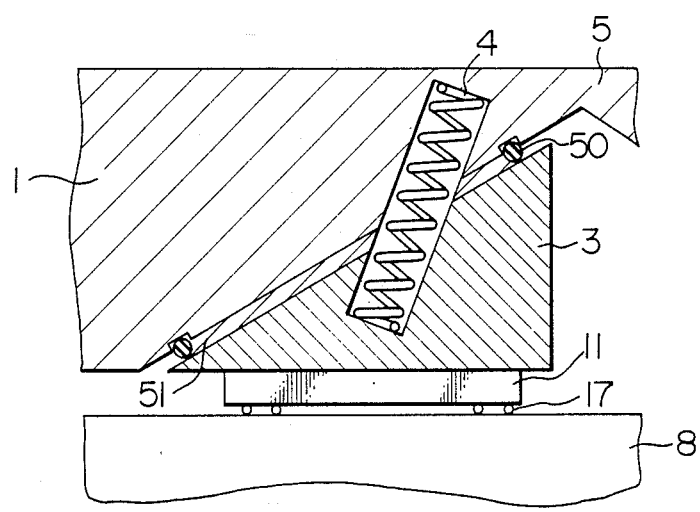
FIG. 11 is a diagrammatic cross sectional view of a seventh embodiment of the present invention.

FIG. 11 is a cross sectional view of a seventh embodiment of the present invention. Rubber seals 50 having good airtightness and a resin 51 having a good lubricating ability are charged in the space between the heat transfer block 1 and each of the heat conducting members 3. The seventh embodiment differs from the first embodiment in that, although, in the first embodiment, each of the chips 11 is cooled by a pair of heat conducting members 3, each of the chips 11 is cooled by one heat conducting member 3; and in that the resin 51 is packed between the rubber seals 50 in the space between the heat transfer block 1 and each of the heat conducting members 3. The effect characteristic of the seventh embodiment is that the level of heat resistance is low since heat is conducted through the resin having a good lubricating ability.

Figure 12:
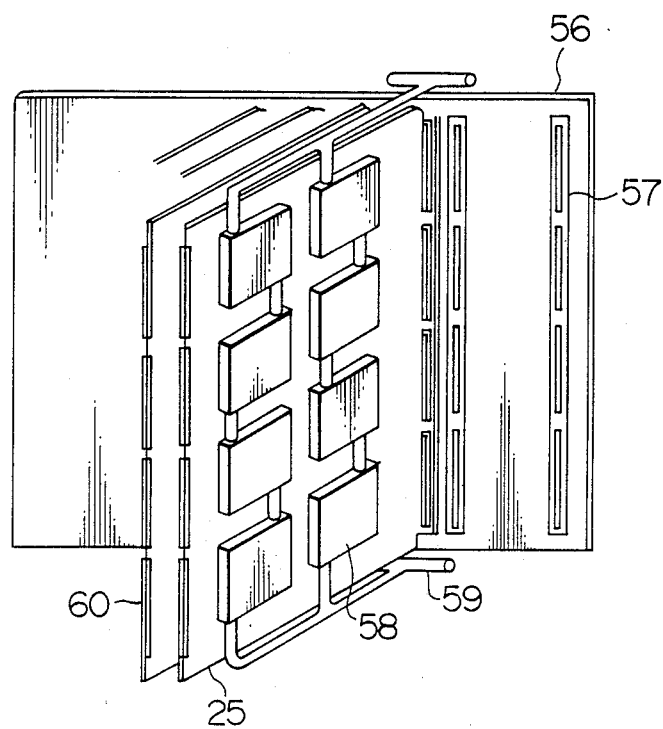
FIG. 12 is a schematic perspective view, with portions omitted for the sake of simplicity, of a mounting structure for mounting the first embodiment of the present invention on a computer.

FIG. 12 is a schematic perspective view, with portions omitted for the sake of simplicity, of a mounting structure for mounting the first embodiment of the present invention on a computer.

LSI multi-chip module packages 58 are mounted on each water-cooled multi-layer ceramic board, and are connected to a corresponding multi-layer board 25. Connecting terminals are provided on the edges of each of the multi-layer boards 25. Connectors 60 are connected to opposite edges of each of the multi-layer boards 25, and the multi-layer boards 25 are connected to external terminals through the connectors 60. The connectors 60 on the other side are connected to multi-core connectors which are provided on a back board 56. In this manner, a three-dimensional mounting structure is formed. The LSI chips 11 are cooled by water circulating through cooling pipes 59.

The above-described arrangement enables highly efficient cooling and hence a compact mounting structure.

It will be appreciated from the foregoing that, in accordance with the present invention, each of the heat conducting members can be displaced in accordance with the vertical and horizontal inclinations of a corresponding semiconductor chip to cool the semiconductor chip upon being brought into surface contact therewith while allowing substantially free displacement of the semiconductor chip. Accordingly, highly efficient cooling can be achieved.

What is claimed is:

1. A cooling apparatus for cooling a semiconductor integrated circuit chip having a cooling flat surface, comprising:

a heat transfer block to be cooled by a coolant, said heat transfer block having a recess confined by at least one inclined surface;

at least one heat conducting member having a contact flat surface corresponding to said cooling flat surface and being kept in contact with said heat transfer block and said semiconductor integrated circuit chip at the same time, the surface of said heat conducting member in contact with said inclined surface of said recess having a curved surface so as to form a line contact; and a resilient member for urging said at least one heat conducting member with respect to said heat transfer block and said semiconductor integrated circuit chip;

said at least one heat conducting member having at least one inclined surface which is inclined with respect to said cooling flat surface of said semiconductor integrated circuit chip, said at least one heat conducting member being capable of sliding and/or rotating while being kept in contact with said heat transfer block so that, even if said semiconductor integrated circuit chip is displaced in any direction or inclined at any angle with respect to said heat transfer block, the whole of said cooling flat surface of said semiconductor integrated circuit chip can be maintained in contact with said contact surface of said at least one heat conducting member.

2. A cooling apparatus according to claim 1, including a plurality of heat conducting members each formed the shape of a trigonal prism having the shape of a right-angle triangle in cross section, corresponding vertical surfaces of said heat conducting members being opposed to each other with a gap interposed therebetween and being disposed such as to form a combined trigonal prism as a whole, said heat transfer block having a recess formed into the shape that corresponds to the configuration of said combined trigonal prism.

3. A cooling apparatus according to claim 2, wherein at least one of the contact surfaces of said heat conducting members and said heat transfer block which are in contact with each other has a curved surface which is formed into one of partially cylindrical and partially spherical shapes.

4. A cooling apparatus according to claim 2 or 3, wherein said resilient member is disposed in one of the gap between said each of said heat conducting members and said heat transfer block and the gap between said opposing heat conducting members so that the resilient force of said resilient member may act to displace said opposing heat conducting members in the directions away from each other.

5. A cooling apparatus according to claim 1, including a plurality of heat conducting members each formed the shape of a trigonal pyramid, said heat conducting members being combined to form a combined quadrangular pyramid.

6. A cooling apparatus according to claim 1, including a plurality of heat conducting members each formed the shape of a trigonal prism, a side surface of one of said heat conducting members being kept in contact with said cooling surface of said semiconductor integrated circuit chip, with a side surface of each of the others of said heat conducting members being kept in a corresponding one of two side surfaces of said heat conducting members in contact with said semiconductor integrated circuit chip.

7. A semiconductor device comprising:
at least one semiconductor chip having a cooling surface and mounted on a ceramic multi-layer printed circuit board;
a housing cooled by a coolant;
a heat transfer block kept in contact with said housing, said heat transfer block having a recess confined by at least one inclined surface; and
at least one heat conducting member kept in contact with said semiconductor chip and said heat transfer block;
said at least one heat conducting member having at least one inclined surface which in inclined with respect to said cooling surface of said semiconductor chip, said at least one heat conducting member being capable of sliding an/or rotating while being kept in contact with said heat transfer block so that, even if said semiconductor chip is displaced in any direction or inclined at any angle with respect to said heat transfer block, the whole of said cooling surface of said semiconductor ship can be maintained in contact with said contact surface of said at least one heat conducting member, said at least one inclined surface of the at least one heat conducting member being curved so as to form a line contact.

8. A semiconductor device according to claim 7, wherein said housing is fixed to said ceramic multi-layer printed circuit board, a plurality of semiconductor chips being mounted on said ceramic multi-layer printed circuit board.

9. A semiconductor device according to claim 8, wherein said at least one semiconductor chip is mounted on a ceramic carrier board overlying said ceramic multilayer printed circuit board and having a thermal expansion coefficient equivalent to that of said ceramic multilayer printed circuit board, said at least one semiconductor chip and said ceramic carrier board being bonded together by soldering in a flip-flop arrangement, and the gap between said at least one semiconductor chip and said ceramic carrier board being charged with rubber granules having a smaller thermal expansion coefficient than said solder and a resin composition containing inorganic powder.

10. A mounting structure for mounting a semiconductor device combined with a cooling apparatus onto a computer, comprising:
a ceramic multi-layer printed circuit board for carrying a plurality of semiconductor chips each having a cooling surface;
a multi-layer printed circuit board electrically connected to said plurality of semiconductor chips through pins provided on said semiconductor chips;
a backboard electrically connected to said multi-layer printed circuit board through multi-core connectors;
a housing cooled by a coolant fixed to said ceramic multi-layer printed circuit board;
a heat transfer block kept in contact with said housing, said block having a recess confined by at least one inclined surface; and
at least one heat conducting member kept in contact with said semiconductor chip and said heat transfer block;
said at least one heat conducting member having at least one inclined surface which is inclined with respect to said cooling surface of said semiconductor chip, said at least one heat conducting member being capable of sliding and/or rotating while being kept in contact with said heat transfer block so that, even if said semiconductor chip is displaced in any direction or inclined at any angle with respect to said heat transfer block, the whole of said cooling surface of said semiconductor chip can be maintained in contact with said contact surface of said at least one heat conducting member, said at least one inclined surface of the at least one heat conducting member being curved so as to form a line contact.

* * * * *